(12) United States Patent
Jing et al.

(10) Patent No.: US 12,328,850 B2
(45) Date of Patent: Jun. 10, 2025

(54) DATA CENTER COOLING SYSTEM AND DATA CENTER

(71) Applicant: Beijing Bytedance Network Technology Co., Ltd., Beijing (CN)

(72) Inventors: Tangbo Jing, Beijing (CN); Jian Wang, Beijing (CN)

(73) Assignee: Beijing Bytedance Network Technology Co., Ltd., Beijing (CN)

( * ) Notice: Subject to any disclaimer, the term of this patent is extended or adjusted under 35 U.S.C. 154(b) by 0 days.

(21) Appl. No.: 18/759,113

(22) Filed: Jun. 28, 2024

(65) Prior Publication Data
US 2024/0357772 A1   Oct. 24, 2024

Related U.S. Application Data

(63) Continuation of application No. PCT/CN2022/138713, filed on Dec. 13, 2022.

(30) Foreign Application Priority Data

Dec. 30, 2021 (CN) .......................... 202111658729.4

(51) Int. Cl.
H05K 7/20    (2006.01)
(52) U.S. Cl.
CPC ..... *H05K 7/20745* (2013.01); *H05K 7/20254* (2013.01); *H05K 7/20772* (2013.01)
(58) Field of Classification Search
None
See application file for complete search history.

(56) References Cited

U.S. PATENT DOCUMENTS 10,912,229 B1    2/2021  Gao
11,656,665 B2 *  5/2023  Heydari ............... G06F 1/20
                                             700/300
(Continued)

FOREIGN PATENT DOCUMENTS

CN     103206747 A     7/2013
CN     207652877 U     7/2018
(Continued)

OTHER PUBLICATIONS

International Patent Application No. PCT/CN2022/138713; Int'l Search Report; dated Mar. 4, 2023; 3 pages.
(Continued)

*Primary Examiner* — Courtney L Smith
(74) *Attorney, Agent, or Firm* — BakerHostetler

(57) ABSTRACT

The disclosure relates to a data center cooling system including a cooling tower, an air cooling unit, a liquid cooling unit and a cabinet, the air cooling unit including a first heat exchanger, a fan and an air returning channel, the liquid cooling unit including a second heat exchanger, the cabinet including a server. A coolant outlet of the cooling tower is connected to a coolant inlet of the first heat exchanger and a first coolant inlet of the second heat exchanger, a coolant outlet of the first heat exchanger and a first coolant outlet of the second heat exchanger are connected to a coolant inlet of the cooling tower, a second coolant outlet of the second heat exchanger is connected to a coolant inlet of the server, and a coolant outlet of the server is connected to a second coolant inlet of the second heat exchanger.

18 Claims, 6 Drawing Sheets

(56) References Cited

U.S. PATENT DOCUMENTS

| | | | |
|---|---|---|---|
| 12,048,128 B2 * | 7/2024 | Keisling | F28D 15/00 |
| 2013/0118710 A1 * | 5/2013 | Chen | F28D 15/00 |
| | | | 165/104.11 |
| 2013/0138252 A1 | 5/2013 | Chainer et al. | |
| 2019/0037730 A1 * | 1/2019 | Gao | H05K 7/20281 |
| 2020/0404813 A1 * | 12/2020 | Gao | H05K 7/20745 |
| 2021/0051819 A1 * | 2/2021 | Gao | H05K 7/20818 |
| 2021/0378149 A1 * | 12/2021 | Gao | H05K 7/20736 |
| 2022/0201902 A1 * | 6/2022 | Shaw | H05K 7/20836 |

FOREIGN PATENT DOCUMENTS

| | | |
|---|---|---|
| CN | 207751075 U | 8/2018 |
| CN | 108834366 A | 11/2018 |
| CN | 110958812 A | 4/2020 |
| CN | 111031770 A | 4/2020 |
| CN | 210519308 U | 5/2020 |
| CN | 113365477 A | 9/2021 |
| CN | 114269129 A | 4/2022 |
| CN | 216626506 U | 5/2022 |

OTHER PUBLICATIONS

Chinese Patent Application No. 202111658729.4; Office Action dated Nov. 25, 2024; 18 pages with machine translation.
European Patent Application No. 22914231.0; Extended European Search Report dated Mar. 5, 2025, 11 pages.

* cited by examiner

DATA CENTER COOLING SYSTEM AND DATA CENTER

CROSS-REFERENCE OF RELATED APPLICATIONS

The present application is a continuation of International Patent Application No. PCT/CN2022/138713, filed on Dec. 13, 2022, which claims priority to Chinese Patent Application No. 202111658729.4, filed on Dec. 30, 2021, and entitled "DATA CENTER COOLING SYSTEM AND DATA CENTER". The entirety of the above-mentioned Chinese Patent Application is incorporated herein by reference.

FIELD

The present disclosure relates to the field of data center, specifically, to a data center cooling system and a data center.

BACKGROUND

With rapid development of information technologies such as Internet of Things, big data, and cloud computing, the demand for a data center is increasing day by day. In order to ensure the normal operation of the data center, the data center needs to be cooled during the operation of the data center.

Currently, the data center is mostly cooled using liquid cooling combined with air conditioning supplementary cooling. The air conditioning cooling unit mainly includes a compressor, an expansion valve, an evaporator, a condenser and other structures. On one hand, due to the large energy consumption of the air conditioning cooling unit during operation, the total energy consumption of the data center will increase, which is not conducive to the realization of energy saving of the data center, reducing the PUE (Power Usage Effectiveness, PUE=total equipment energy consumption of the data center/IT equipment energy consumption) of the data center; on the other hand, the air conditioning cooling unit has more equipment, which is not conducive to implementing rapid deployment of cooling centers.

SUMMARY

An object of the present disclosure is to provide a data center cooling system and data center to solve the technical problems existing in related technologies.

In order to achieve the above object, according to a first aspect of the present disclosure, a data center cooling system is provided, comprising a cooling tower, an air cooling unit, a liquid cooling unit and a cabinet, the air cooling unit comprising a first heat exchanger, a fan and an air returning channel, the liquid cooling unit comprising a second heat exchanger, the cabinet comprising a server;

a coolant outlet of the cooling tower is connected to a coolant inlet of the first heat exchanger and a first coolant inlet of the second heat exchanger, a coolant outlet of the first heat exchanger and a first coolant outlet of the second heat exchanger are connected to a coolant inlet of the cooling tower, a second coolant outlet of the second heat exchanger is connected to a coolant inlet of the server, and a coolant outlet of the server is connected to a second coolant inlet of the second heat exchanger;

an air inlet of the air returning channel is connected to an air outlet of the server and is configured to transport air flowing out of the air outlet of the server to the first heat exchanger, the fan is configured to cause the air flowing out of an air outlet of the air returning channel to flow to the server after flowing through the first heat exchanger, so that the air flow through the first heat exchanger can enter the server through an air inlet of the server.

Optionally, the server comprises a central processing unit, a hard disk drive, a network interface controller, a dual inline memory module and a power supply;

the central processing unit is provided with a cold plate, the second coolant outlet of the second heat exchanger is connected to a coolant inlet of the cold plate, a coolant outlet of the cold plate is connected to the second coolant inlet of the second heat exchanger, the coolant inlet of the cold plate is the coolant inlet of the server, the coolant outlet of the cold plate is the coolant outlet of the server;

the central processing unit, the hard disk drive, the network interface controller, the dual inline memory module and the power supply are all arranged between the air inlet of the server and the air outlet of the server.

Optionally, the air inlet of the server is arranged opposite to the air outlet of the server, the hard disk drive and the network interface controller are arranged close to the air inlet of the server, the power supply is arranged close to the air outlet of the server, and the central processing unit and the dual inline memory module are located between both the hard disk drive and the network interface controller and the power supply.

Optionally, both the central processing unit and the cold plate are multiple, the multiple cold plates and the multiple central processing units are arranged in one-to-one correspondence, and the multiple cold plates are connected in series or in parallel with each other.

Optionally, the cabinet comprises a plurality of servers, the cabinet further comprises a water segregator and a water collector, the water segregator comprises a water segregating pipe, a first water incoming port and a first water outcoming port arranged on the water segregating pipe, the first water outcoming port is multiple, and the water collector comprises a water collecting pipe, a second water incoming port and a second water outcoming port arranged on the water collecting pipe, the second water incoming port is multiple;

the second coolant outlet of the second heat exchanger is connected to the first water incoming port, each first water outcoming port is connected to the coolant inlet of the corresponding server, each second water incoming port is connected to the coolant outlet of the corresponding server, and the second water outcoming port is connected to the second coolant inlet of the second heat exchanger.

Optionally, at least one of a filtering device, a sterilization device, and a descaling device is provided at the second coolant outlet of the second heat exchanger.

Optionally, the air cooling unit further comprises a mounting structure on which an air incoming hole and an air outcoming hole are formed, and the first heat exchanger and the fan are mounted on the mounting structure and are located between the air incoming hole and the air outcoming hole;

wherein the air outlet of the air returning channel is connected to the air incoming hole; or, the mounting structure is configured to be arranged in a machine room, and to separate the interior of the machine room into a first space and a second space, the air incoming hole is located on a side of the mounting structure close to the first space, and the air outcoming hole is located on a side of the mounting structure close to the second space, the server is arranged within the second space, and the air outlet of the air returning channel is in communication with the first space.

Optionally, the air cooling unit further comprises an air filtering mesh arranged at the air incoming hole.

Optionally, the data center cooling system further comprises a first water pump and a second water pump, the first water pump is configured to pump the coolant flowing out of the coolant outlet of the cooling tower to the first heat exchanger and the second heat exchanger, and the water pump is configured to pump the coolant flowing out of the second coolant outlet of the second heat exchanger to the server.

Optionally, the data center cooling system further comprises a first switching valve and a second switching valve, the first switching valve is arranged at the coolant outlet of the first heat exchanger and/or the first coolant outlet of the second heat exchanger, and the second switching valve is arranged at the coolant inlet of the server.

According to a second aspect of the present disclosure, a data center is provided, including the data center cooling system as described above.

During a cooling process of the server, a portion of the coolant at a lower temperature flowing out of the coolant outlet of the cooling tower flows into the first heat exchanger, and the other portion flows into the second heat exchanger. When the fan is running, the hot air flowing out of the air outlet of the air returning channel and absorbing heat in the server flows through the first heat exchanger and exchanges heat with the coolant in the first heat exchanger, so that the temperature of the hot air that absorbs heat in the server is reduced. The air at the reduced temperature blows into the server and continues to cool the server, achieving air cooling of the server. The coolant at a higher temperature after absorbing the heat of the server flows out of the coolant outlet of the server and flows into the second heat exchanger through the second coolant inlet of the second heat exchanger. In the second heat exchanger, the coolant at the higher temperature after absorbing the heat of the server exchange heat with the coolant at the lower temperature flowing out of the cooling tower, so that the coolant at the lower temperature flows out of the second coolant outlet of the second heat exchanger. The coolant flows to the server to absorb the heat of the server. The heat-absorbed coolant flowing out of the coolant outlet of the first heat exchanger and the first coolant outlet of the second heat exchanger finally returns to the cooling tower and discharges the heat to the atmosphere.

Other features and advantages of the present disclosure will be detailed in the detailed description section that follows.

BRIEF DESCRIPTION OF THE DRAWINGS

The drawings are used to provide a further understanding of the present disclosure and constitute a part of the specification, together with the following detailed description, are used to explain the present disclosure, but do not constitute a limitation of the present disclosure. In the drawings.

REFERENCE NUMERALS

Figure 1:
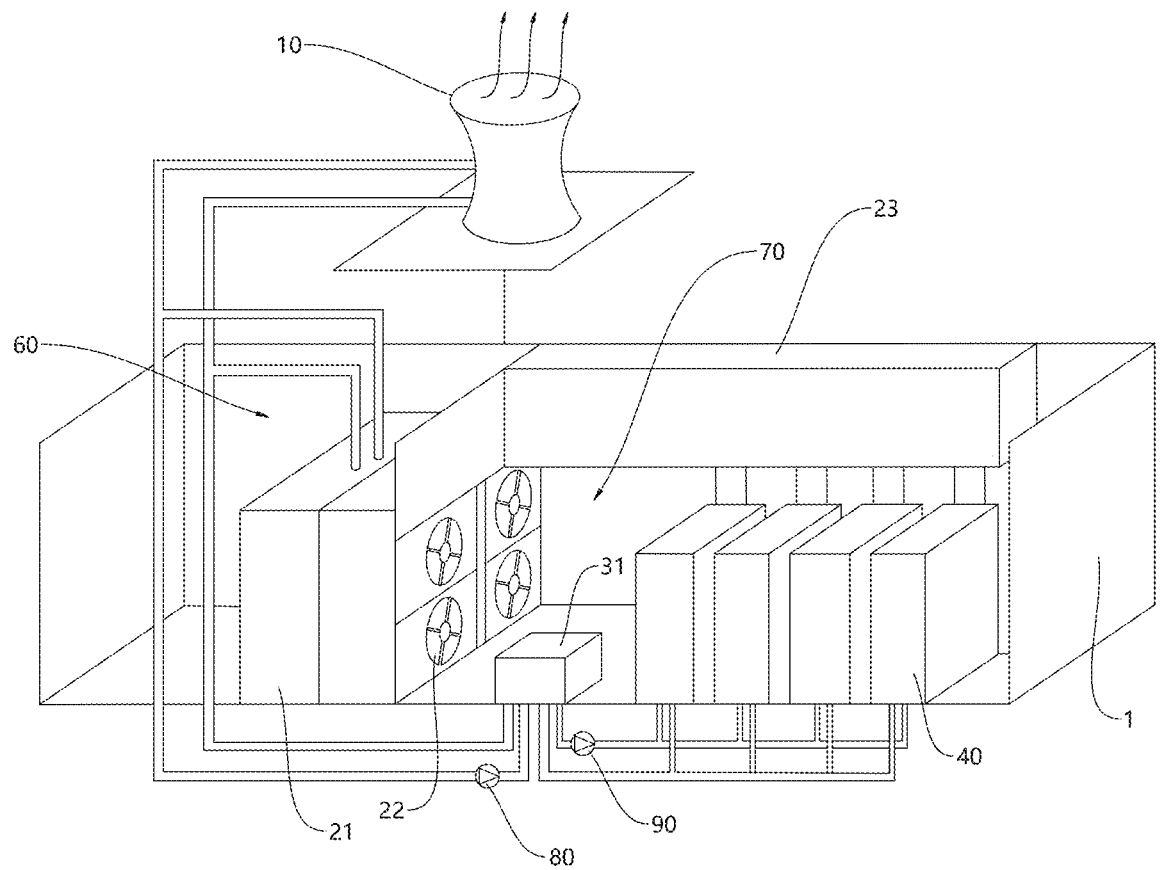
FIG. 1 is a schematic perspective view of a data center cooling system provided by an example embodiment of the present disclosure.

1—machine room; 10—cooling tower; 20—air cooling unit; 21—first heat exchanger; 22—fan; 23—air returning channel; 30—liquid cooling unit; 31—second heat exchanger; 40—cabinet; 41—server; 410—central processing unit; 420—hard disk drive; 430—network interface controller; 440—dual inline memory module; 450—power supply; 46—water segregator; 460—water segregating pipe; 461—first water incoming port; 462—first water outcoming port; 47—water collector; 470—water collecting pipe; 471—second water incoming port; 472—second water outcoming port; 48—air inlet of the server; 49—air outlet of the server; 50—cold plate; 60—first space; 70—second space; 80—first water pump; 90—second water pump; 95—first switching valve; 96—second switching valve; 100—air outcoming hole.

DETAILED DESCRIPTION

Detailed description of the present disclosure will be described in detail below with reference to the accompanying drawings. It should be understood that the detailed description described here is only used to illustrate and explain the present disclosure, and is not used to limit the present disclosure.

In the present disclosure, unless otherwise stated, "connection" may be a direct connection or an indirect connection, "inside and outside" refers to the inside and outside of the corresponding structure or component outline; "far and near" refers to far from or near to the corresponding structure or component.

With the high-density integration of IT equipment of an electronic information system machine room, the phenomenon of increasing equipment heat dissipation and machine room heat dissipation has begun to attract strong attention from all walks of life. According to research, IT/telecommunications-related carbon emissions have become one of the largest sources of greenhouse gas emissions, resulting in 860 million tons of carbon emissions per year, and the emission momentum in this field is still growing rapidly with the growing global demand for computing, data storage, and communication technologies. Even if people vigorously improve the energy efficiency of equipment, machine rooms and other devices and data centers, global IT-related carbon emissions will reach 1.54 billion tons by 2020. Therefore, more and more people are paying attention to the construction of green machine rooms.

PUE (Power Usage Effectiveness) value has become an internationally accepted measure of data center power usage efficiency. The PUE value is the ratio of all energy consumed by the data center to the energy consumed by the IT loads. The closer the PUE value is to 1, the higher the greenness of a data center. Currently, the PUE value of most data centers is between 2-3. Therefore, how to reduce the PUE value of the data center and reduce the carbon emissions related to the data center is crucial.

In view of this, according to a first aspect of the present disclosure, a data center cooling system is provided. Referring to FIGS. 1-6, the data center cooling system includes a cooling tower 10, an air cooling unit 20, a liquid cooling unit 30 and a cabinet 40. The air cooling unit 20 includes a first heat exchanger 21, a fan 22 and an air returning channel 23. The liquid cooling unit 30 includes a second heat exchanger 31, and the cabinet 40 includes a server 41.

A coolant outlet of the cooling tower 10 is connected to a coolant inlet of the first heat exchanger 21 and a first coolant inlet of the second heat exchanger 31. A coolant outlet of first heat exchanger 21 and a first coolant outlet of the second heat exchanger 31 are connected to a coolant inlet of cooling tower 10. A second coolant outlet of the second heat exchanger 31 is connected to a coolant inlet of the server 41, and a coolant outlet of the server 41 is connected to a second coolant inlet of the second heat exchanger 31. That is, the first heat exchanger 21 and the second heat exchanger 31 are connected in parallel with each other. An air inlet of the air returning channel 23 is connected to an air outlet 49 of the server 41 and is used to transport the air flowing out of the air outlet 49 of the server 41 to the first heat exchanger 21. The fan 22 is used to cause the air flowing out of the air outlet of the air returning channel 23 flow to the server 41 after passing through the first heat exchanger 21, so that the air flowing through the first heat exchanger 21 can enter the server 41 through the air inlet 48 of the server 41.

During the cooling process of the server 41, a portion of the coolant at a lower temperature flowing out of the coolant outlet of the cooling tower 10 flows into the first heat exchanger 21, and the other portion flows into the second heat exchanger 31. When the fan 22 is running, the hot air flowing out of the air outlet of the air returning channel 12 and absorbing heat in the server 41 flows through the first heat exchanger 21 and exchanges heat with the coolant in the first heat exchanger 21, so that the temperature of the hot air that absorbs heat in the server 41 is reduced. The air at the reduced temperature blows into the server 41 and continues to cool the server 41, achieving air cooling of the server 41. The coolant at a higher temperature after absorbing the heat of the server 41 flows out of the coolant outlet of the server 41 and flows into the second heat exchanger 31 through the second coolant inlet of the second heat exchanger 31. In the second heat exchanger 31, the coolant at the higher temperature after absorbing the heat of the server 41 exchange heat with the coolant at the lower temperature flowing out of the cooling tower 10, so that the coolant at the lower temperature flows out of the second coolant outlet of the second heat exchanger 31. The coolant flows to the server 41 to absorb the heat of the server 41. The heat-absorbed coolant flowing out of the coolant outlet of the first heat exchanger 21 and the first coolant outlet of the second heat exchanger 31 finally returns to the cooling tower 10 and discharges the heat to the atmosphere.

With the above technical solution, the data center cooling system provided by the present disclosure discharges the heat of the server 41 into the atmosphere through the cooling tower 10. In other words, the cooling capacity for both liquid cooling and air cooling of the server 41 comes from the cooling tower 10. According to statistical data, the cooling of existing data centers accounts for about 40% of the total power consumption of a machine room 1, and the use of air-conditioning cooling units is one of the important factors leading to an increase in total cooling power consumption. Comparing the data center cooling system provided by the present disclosure with the existing technical solutions that provide cooling capacity through a plurality of devices (such as a compressor, an expansion valve, an evaporator, a condenser) in the air-conditioning cooling unit, the data center cooling system provided by the present disclosure does not require the use of air-conditioning cooling unit, so that the energy consumption required for cooling the server of the present disclosure is lower, which is conducive to reducing the total energy consumption of the data center, thereby reducing the PUE of the data center, thereby reducing carbon emissions, and helping to achieve targets of "peak carbon dioxide emissions and carbon neutrality."

Moreover, since the data center cooling system provided by the present disclosure is not cooled by the air-conditioning cooling unit, that is, Freon is not used as a refrigerant. On one hand, it is possible to avoid the leakage of Freon which may pollute the environment. On the other hand, it is also possible to avoid fluoride emissions. Since fluorine-containing gas is also a greenhouse gas, it avoids the emission of fluorine-containing gas from increasing the greenhouse effect.

In addition, compared with the existing technical solution of cooling the data center through liquid cooling combined with air conditioning supplementary cooling, the data center cooling system provided by the present disclosure has a simpler architecture and therefore has higher reliability, and the cost is lower, and when deploying a data center, it can achieve rapid deployment of the data center. Moreover, since the cooling temperature of the cooling tower 10 is related to the wet-bulb temperature of the environment where the cooling tower 10 is located, rather than the dry-bulb temperature (i.e., ambient temperature) of the environment where the cooling tower 10 is located, the wet-bulb temperature in most parts of the world can meet the requirements for the temperature of the coolant flowing out of the coolant outlet of the cooling tower 10. Therefore, the data center cooling system provided by the present disclosure is not easily restricted by the regional ambient temperature and can be applied to most regions around the world.

Through the data center cooling system provided by the present disclosure, the server 41 can be liquid-cooled with the coolant of 35° C.-40° C., and at the same time, the fan 22 and first heat exchanger 21 can be used to transport air of 35° C.-40° C., to the server 41 for air cooling. The temperature of the heat-exchanged air flowing out of the air outlet 49 of the server 41 is about 40° C.-45° C., achieving "large air volume and small temperature difference" heat dissipation for the server 41.

Optionally, the number of the first heat exchanger 21, the second heat exchanger 31 and the fan 22 described above may be one or multiple, which is not limited in the present disclosure.

Optionally, the cooling tower 10 described above can be an open cooling tower, a closed cooling tower, a natural ventilation cooling tower, a mechanical ventilation cooling tower, a mixed ventilation cooling tower, a wet cooling tower, a dry cooling tower, a wet and dry cooling tower, etc. The present disclosure does not limit the specific type, quantity, size, shape, etc. of the cooling tower 10.

Figure 5:
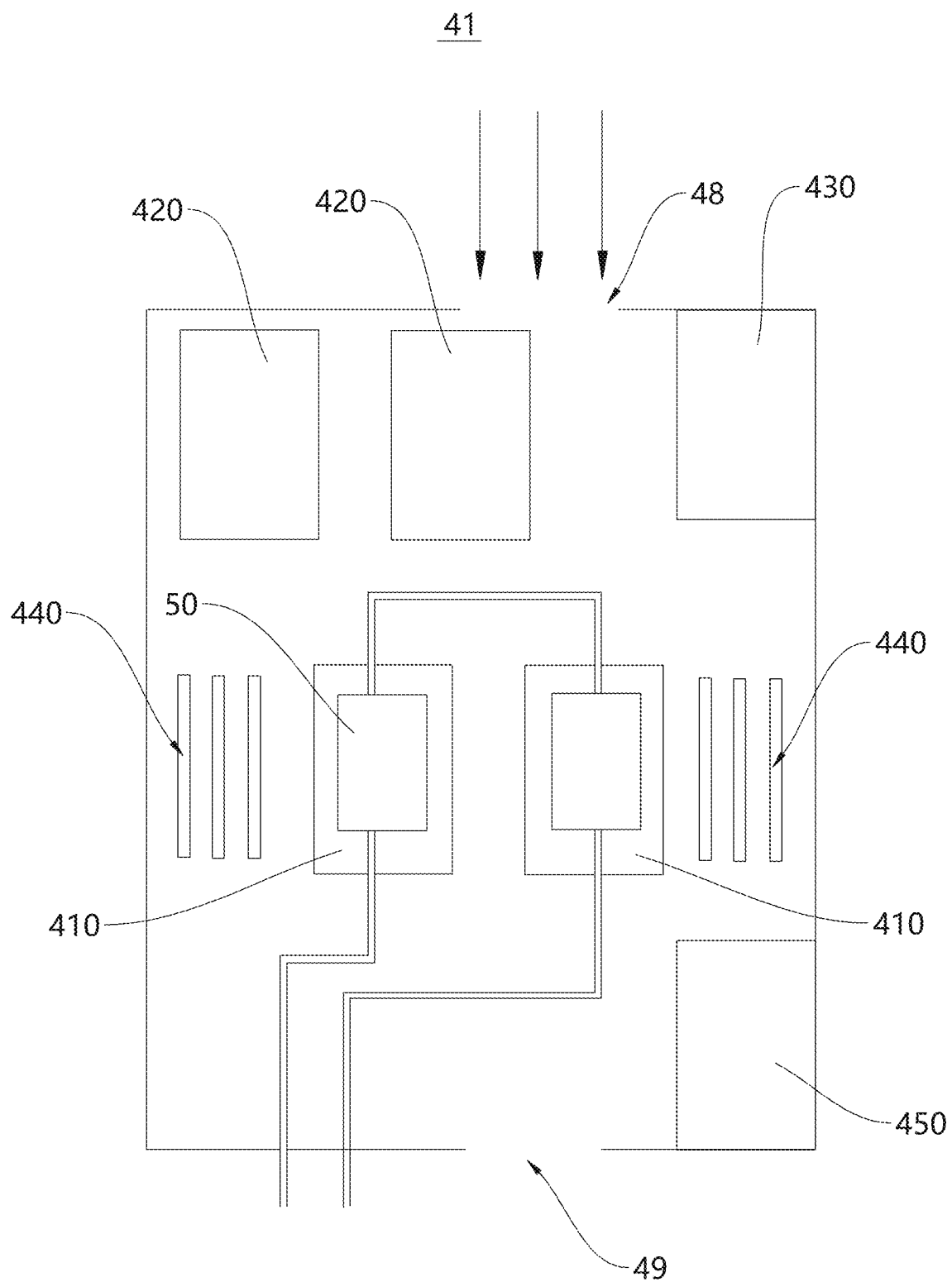
FIG. 5 is an internal schematic view of a server of a data center cooling system provided by an example embodiment of the present disclosure, in which the direction pointed by the arrow is the flow direction of the air flow.
Figure 6:
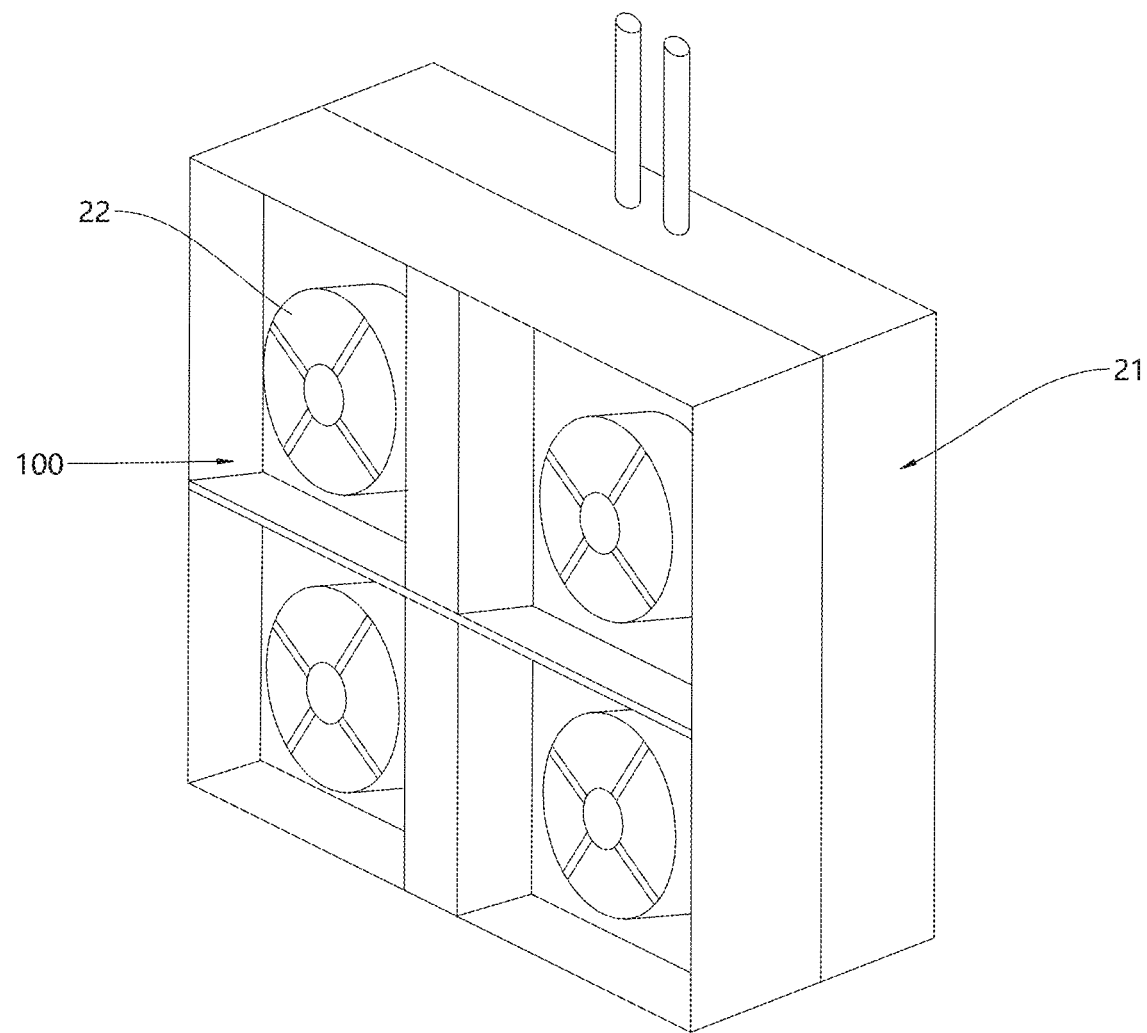
FIG. 6 is a schematic view of the cooperation between the first heat exchanger and the fan of the data center cooling system provided by an example embodiment of the present disclosure.

As an implementation manner, as shown in FIG. 5, the above-mentioned server 41 includes a central processing unit 410 (CPU), a hard disk drive 420 (HDD), a network interface controller 430 (NIC), and a dual inline memory module 440 (DIMM) and a power supply 450 (Power supply unit, PSU). The central processing unit 410 is provided with a cold plate 50. The second coolant outlet of the second heat exchanger 31 is connected to the coolant inlet of the cold plate 50. The coolant outlet of the cold plate 50 is connected to the second coolant inlet of the second heat exchanger 31. The coolant inlet of cold plate 50 is the coolant inlet of the server 41, and the coolant outlet of cold plate 50 is the coolant outlet of the server 41. The central processing unit 410, the hard disk drive 420, the network interface controller 430, the dual inline memory module 440 and the power supply 450 are all arranged between the air inlet 48 of the server 41 and the air outlet 49 of the server 41.

During the cooling process of the server 41 by the data center cooling system, the coolant in the second heat exchanger 31 enters the cold plate 50 through the second coolant outlet and the coolant inlet of the cold plate 50. The coolant in the cold plate 50 is performing heat exchange with the central processing unit 410, absorbing the heat of the central processing unit 410 to achieve liquid cooling of the central processing unit 410. The coolant flowing out of the coolant outlet of the cold plate 50 can perform heat exchange with the coolant flowing from the cooling tower 10 to the second heat exchanger 31, thereby bringing the heat of the central processing unit 410 to the cooling tower 10 and releasing the heat into the atmosphere. Since the central processing unit 410, the hard disk drive 420, the network interface controller 430, the dual inline memory module 440 and the power supply 450 are all mounted between the air inlet 48 of the server 41 and the air outlet 49 of the server 41, during the process of the fan 22 blowing the air at a lower temperature flowing through the first heat exchanger 21 to the interior of the data center, the air flows in from the air inlet 48 of the server 41 and out from the air outlet 49 of the server 41. As the air flows inside the server 41, it can take away the heat from the central processing unit 410, the hard disk drive 420, the network interface controller 430, the dual inline memory module 440 and the power supply 450, achieving the cooling of the central processing unit 410, the hard disk drive 420, the network interface controller 430, the dual inline memory module 440 and the power supply 450.

Here, in the data center cooling system provided by the present disclosure, the central processing unit 410 is liquid-cooled through the cold plate 50, which can effectively reduce the temperature of the central processing unit 410 first, avoiding the internal temperature of the server 41 to be too high during the process of the air flowing from the air inlet 48 of the server 41 to the air outlet 49 of the server 41 to bring out the heat of the central processing unit 410, which reversely heats the hard disk drive 420, the network interface controller 430, the dual inline memory module 440 and the power supply 450, or affects the heat dissipation of the air inside server 41 on the hard disk drive 420, the network interface controller 430, the dual inline memory module 440 and the power supply 450, ensuring the cooling effect and cooling efficiency.

Optionally, in an embodiment provided by the present disclosure, as shown in FIG. 5, the air inlet 48 of the server 41 may be arranged opposite to the air outlet 49 of the server 4, the hard disk drive 420 and the network interface controller 430 are both arranged close to the air inlet 48 of the server 41, and the power supply 450 is arranged close to the air outlet 49 of the server 41, and the central processing unit 410 and the dual inline memory module 440 are located between both the hard disk drive 420 and the network interface controller 430 and the power supply 450. Since the hard disk drive 420 and the network interface controller 430 have a weak ability to withstand temperature, and the temperature of the air at the air inlet 48 of the server 41 is low, the hard disk drive 420 and the network interface controller 430 are arranged close to the air inlet 48 of the server 41 to ensure the cooling of the hard disk drive 420 and the network interface controller 430, and the power supply 450 has a strong ability to withstand medium or high temperatures, so the power supply 450 is arranged close to the air outlet 49 of the server 41.

With the above arrangement, after the air enters the server 41 from the air inlet 48 of the server 41, it will blow through the hard disk drive 420, the network interface controller 430, the dual inline memory module 440, the central processing unit 410 and the power supply 450 in sequence, and then flow out of the air outlet 49 of the server 41, such that the cooling needs of the hard disk drive 420, the network interface controller 430, the dual inline memory module 440, the central processing unit 410 and the power supply 450 inside the server 41 can be met.

Here, as shown in FIG. 5, both the central processing unit 410 and the cold plate 50 are multiple. The multiple cold plates 50 and the multiple central processing units 410 are arranged in one-to-one correspondence. The multiple cold plates 50 may be connected in series or in parallel with each other.

For embodiments with of the multiple cold plates 50 connected in series have the advantages of simple structural components and easy to ensure that the flow rate of the coolant in each cold plate 50 is approximately the same. During the cooling process of the multiple cold plates 50 by the liquid cooling unit 30, the coolant flowing out of the second coolant outlet of the second heat exchanger 31 can first enter a first cold plate 50, and then flow to the next cold plate 50 in sequence, and finally flow out of the coolant outlet of the last cold plate 50. Here, it should be noted that in order to prevent the temperature of the coolant from rising after absorbing the heat of the upstream central processing unit 410 and affecting the absorption of heat from the next central processing unit 410, in the present disclosure, the temperature difference between the coolant between adjacent cold plates 50 can be reduced by increasing the flow rate of the coolant from the second heat exchanger 31 to the cold plate 50, so that each central processing unit 410 can obtain better cooling effect.

For embodiments with the multiple cold plates 50 connected in parallel, the coolant with lower temperature can flow through different cold plates 50 respectively. The coolant will not be interfered by the heat exchange of the adjacent central processing unit 410 during the flow process, and, because the coolant in different cold plates 50 is independent of each other, precise control of the heat dissipation of the multiple central processing units 410 can be achieved by controlling the flow of coolant flowing through different cold plates 50.

Figure 3:
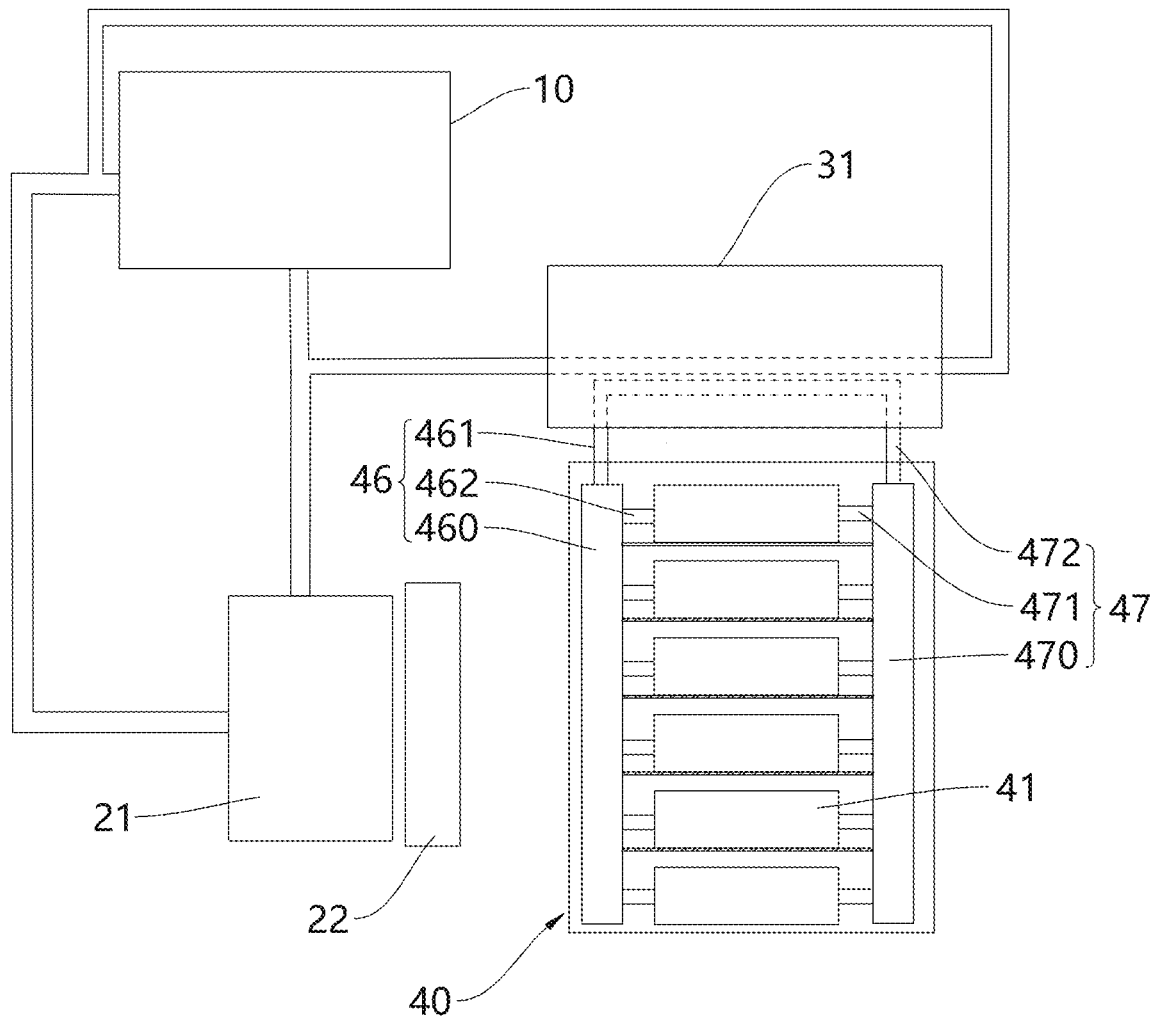
FIG. 3 is a schematic view of the connection between the cooling tower and the first heat exchanger, the second heat exchanger, the server in the data center cooling system provided by an example embodiment of the present disclosure.

Optionally, in the present disclosure, as shown in FIG. 3, in order to improve the integration of the data center, the cabinet 40 may include a plurality of servers 41. The cabinet 40 may also include a water segregator 46 and a water collector 47. The water segregator 46 includes a water segregating pipe 460, a first water incoming port 461 and a first water outcoming port 462 arranged on the water segregating pipe 460. The first water outcoming port 462 is multiple. The water collector 47 includes a water collecting pipe 470, a second water incoming port 471 and a second water outcoming port 472 arranged on the water collecting pipe 470. The second water incoming port 471 is multiple. The second coolant outlet of the second heat exchanger 31 is connected to the first water incoming port 461. Each first water outcoming port 462 is connected to the coolant inlet of the corresponding server 41. Each second water incoming port 471 is connected to the coolant outlet of the corresponding server 41. The second water outcoming port 472 is connected to the second coolant inlet of the second heat exchanger 31.

In other words, during the cooling and heat dissipation process of the server 41, the coolant enters the water segregating pipe 460 through the second coolant outlet of the second heat exchanger 31 and the first water incoming port 461 of the water segregator 46. The water segregating pipe 460 is provided with the first water outcoming port 462 connected to the coolant inlet of the corresponding server 41. In this way, the coolant entering the water segregator 46 enters the corresponding server 41 through the first water outcoming port 462. After absorbing the heat of the server 41, the coolant flows into the collecting pipe 470 through the second water incoming port 471 of the water collector 47. Subsequently, the high-temperature coolant flowing into the water collecting pipe 470 exchanges heat with the low-temperature coolant flowing out of the cooling tower 10, and then becomes low-temperature coolant again and flows into the water segregator 46. In this cycle, a continuous cooling and heat dissipation of the multiple servers 41 can be implemented.

In the present disclosure, since the coolant directly flows from the second coolant outlet of the second heat exchanger 31 into the cold plate 50 provided on the central processing unit 410, the central processing unit 410, as a core component of the server 41, has high requirements for the cleanliness of the coolant. Optionally, the second coolant outlet of the second heat exchanger 31 may be provided with at least one of a filtering device, a sterilization device, and a descaling device. By setting the filtering device, the sterilization device, and the descaling device at the second coolant outlet of the second heat exchanger 31, the cleanliness of the coolant circulating in the cold plate 50 can be improved, avoiding or reducing the clogging and poor flow of the coolant in the cold plate, further improving the cooling efficiency and effect of the central processing unit 410.

Optionally, the cabinet 40 may be multiple, and the servers 41 in the multiple cabinets 40 are connected in parallel with each other, so that the coolant flowing out of the second coolant outlet of the second heat exchanger 31 can be divided into a plurality of streams and flow to the servers 41 in different cabinets 40.

Figure 4:
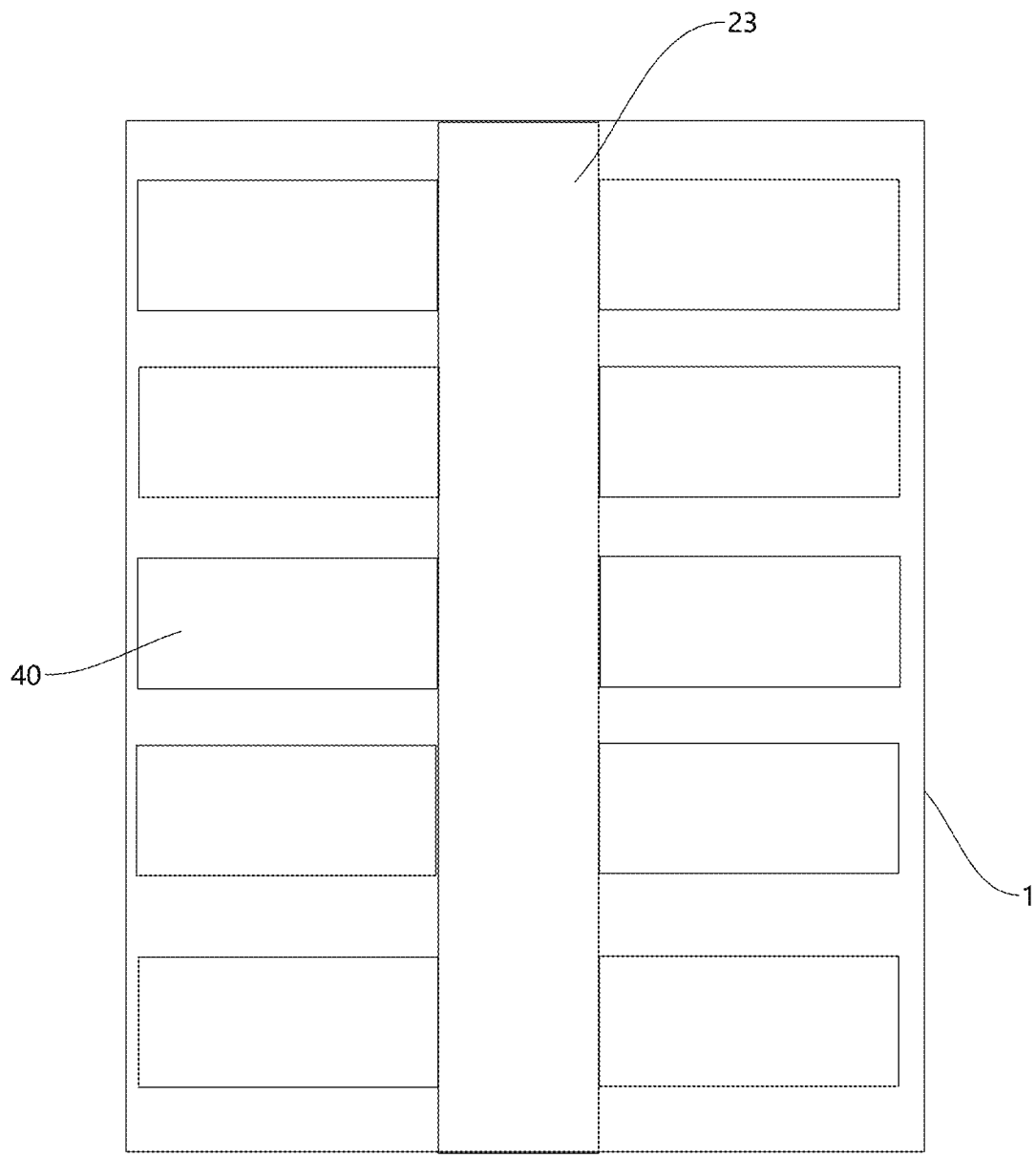
FIG. 4 is a schematic view of the arrangement position between a plurality of cabinets and an air returning channel in a data center cooling system provided by an example embodiment of the present disclosure.

For the case where the cabinet 40 is multiple, as shown in FIG. 4, the air outlet 49 of the server 41 of one cabinet 40 can be arranged opposite to the air outlet 49 of the server 41 of another cabinet 40, and the air outlets 49 of the two servers 41 are located between the air inlets 48 of the two servers 41, thereby facilitating the arrangement of the air returning channel 23.

Optionally, the air cooling unit 20 may further include a mounting structure on which an air incoming hole and an air outcoming hole 100 are formed. The first heat exchanger 21 and the fan 22 are mounted on the mounting structure and located between the air incoming hole and the air outcoming hole 100. In an embodiment provided by the present disclosure, the air outlet of the air returning channel 23 is connected to the air incoming hole. In this way, the hot air flowing out of the air outlet of the air returning channel 23 and absorbing the heat of the server 41 can flow to the first heat exchanger 21 through the air incoming hole of the mounting structure. After the air flow that has absorbed the heat of the server 41 is cooled by the first heat exchanger 21, the Fan 22 re-blows the air flow that has been dissipated by first heat exchanger 21 to the server 41 through the air outcoming hole of the mounting structure, circulating in this manner. Since the air outlet of the air returning channel 23 is connected to the air incoming hole, it can be ensured that all the air that has absorbed the heat of the server 41 flows through the first heat exchanger 21 for heat exchange.

Figure 2:
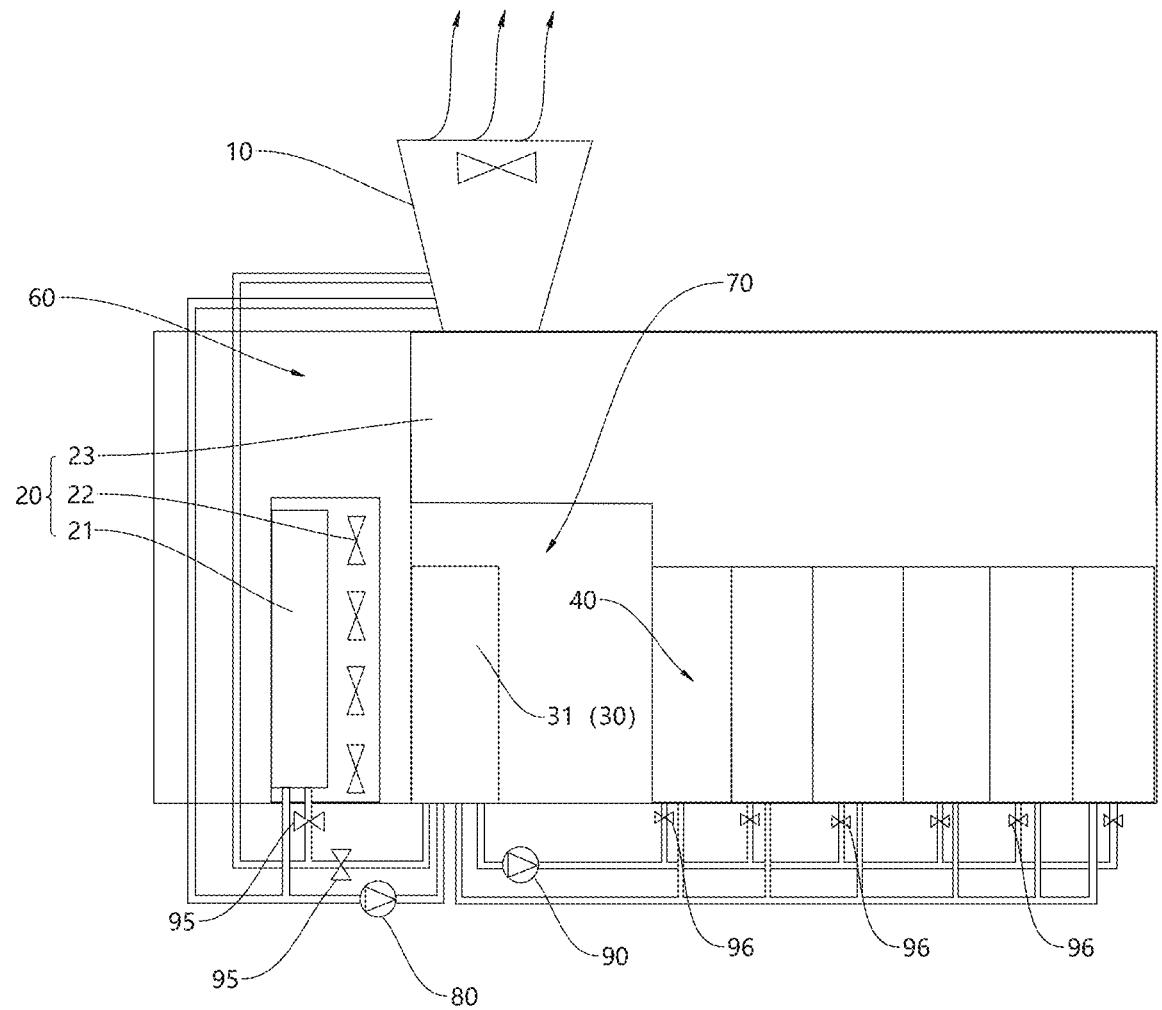
FIG. 2 is a schematic plan view of a data center cooling system provided by an example embodiment of the present disclosure.

In another embodiment provided by the present disclosure, as shown in FIGS. 1-2, the mounting structure is adapted to be arranged in the machine room 1, and to separate the interior of the machine room 1 into a first space 60 and a second space 70. The air incoming hole is located on a side of the mounting structure close to the first space 60, and the air outcoming hole 100 is located on a side of the mounting structure close to the second space 70. The server 41 is arranged within the second space 70, and the air outlet of the air returning channel 23 is in communication with the first space 60. The hot air flowing out of the air outlet of the air returning channel 23 and absorbing the heat of the server 41 can flow into first space 60. Since the first space 60 and the second space 70 are separated by the mounting structure, the hot air in first space 60 will not flow into the second space 70 and cause the temperature of the server in the second space 70 to be increased, and the hot air in first space 60 can flow through first heat exchanger 21 for heat exchange under the action of the fan 22.

The difference between the above two embodiments is that when the air outlet of the air returning channel 23 is connected to the air incoming hole of the mounting structure, the mounting structure may not isolate the internal space of machine room 1, but when the mounting structure isolates the internal space of machine room 1, the air outlet of the air returning channel 23 can be or be not connected to the air incoming hole of the mounting structure.

Optionally, the fan 22 can be arranged close to the air incoming hole of the mounting structure, or can be arranged close to the air outcoming hole 100 of the mounting structure, which is not limited in the present disclosure.

Optionally, in order to prevent the airflow entraining dust and other impurities from entering the server 41, in the present disclosure, the air cooling unit 20 also includes an air filtering mesh arranged at the air incoming hole. The air filtering mesh can filter the air flow before entering the data center and prevent dust carried in the air flow from entering the interior of the server 41 to ensure the operating environment of the server 41.

Optionally, as shown in FIGS. 1 and 2, the data center cooling system also includes a first water pump 80 and a second water pump 90. The first water pump 80 is used to pump the coolant flowing out of the coolant outlet of the cooling tower 10 to the first heat exchanger 21 and the second heat exchanger 31. The second water pump 90 are used to pump the coolant flowing out of the second coolant outlet of the second heat exchanger 31 to the server 41. The first water pump 80 can provide driving force for the flow of coolant in the first heat exchanger 21, and the second water pump 90 can provide driving force for the flow of coolant in the second heat exchanger 31, so that the coolant can continuously circulate in the first heat exchanger 21 and the second heat exchanger 31, achieving uninterrupted cooling and heat dissipation of the data center. Here, the rotation speed of first water pump 80 and second water pump 90 may be adjusted to match the cooling and heat dissipation needs of the server 41. Specifically, when the heat dissipation needs of the server 41 increase, the rotation speed of first water pump 80 and second water pump 90 may be increased accordingly, so that a larger amount of coolant can exchange heat with the server 41 per unit time, improving the heat exchange efficiency with server 41; when the heat dissipation needs of the data center decreases, the rotation speed of the first water pump 80 and second water pump 90 can be lowered accordingly. The rotation speed can meet the heat dissipation needs of the server 41 while reducing the energy consumption of the first water pump 80 and the second water pump 90.

Optionally, the data center cooling system also includes a first switching valve 95 and a second switching valve 96, as shown in FIGS. 1-2. The first switching valve 95 is arranged at the coolant outlet of the first heat exchanger 21 and/or the first coolant outlet of the second heat exchanger 31, the second switching valve 96 is arranged at the coolant inlet of the server 41. Since the first switching valve 95 is arranged at the coolant outlet of the first heat exchanger 21 and/or the first coolant outlet of the second heat exchanger 31, the first heat exchanger 21 and the second heat exchanger 31 can operate simultaneously or independently. Take the embodiments with the first switching valve 95 being provided at the first coolant outlet of the second heat exchanger 31 as an example. When the first switching valve 95 is closed, the coolant flowing out of the coolant outlet of the cooling tower 10 will no longer flow into the second heat exchanger 31 continuously, but only continuously flows into the first heat exchanger 21, so that the continuous air cooling of the server 41 can be achieved only through the air cooling unit 20, without the continuous liquid cooling of the server 41 through the liquid cooling unit 30. In this way, the cooling manner of the server 41 can be selected based on the current temperature of the server 41, which is more beneficial to reduce the energy consumption of data center cooling system. Since the second switching valve 96 is provided at the coolant inlet of the server 41, the coolant entering the server 41 can be conducted and cut off by opening or closing the second switching valve 96. For embodiments with a plurality of servers 41, the coolant can be allowed to enter the server 41 that need to dissipate heat, avoiding the coolant flowing through the server 41 that does not need to dissipate heat, causing the cooling capacity of the coolant to not be effectively utilized.

In order to further reduce the cost of the data center cooling system, the coolant mentioned above can be water. Water is cheap, easy to supply, and will not cause pollution to the atmospheric environment during the heat exchange process.

According to a second aspect of the present disclosure, a data center is provided, including the data center cooling system described above. The data center has all the technical effects of the data center cooling system described above, which will not be described in detail here.

The preferred embodiments of the present disclosure have been described in detail above with reference to the accompanying drawings. However, the present disclosure is not limited to the specific details of the above-mentioned embodiments. Within the scope of the technical concept of the present disclosure, various simple modifications can be made to the technical solutions of the present disclosure. These simple modifications all belong to the protection scope of the present disclosure.

In addition, it should be noted that each of the specific technical features described in the above detailed description can be combined in any suitable way if there is no contradiction. In order to avoid unnecessary repetition, the present disclosure discusses various possible combinations. The method will not be further explained.

In addition, any combination of various embodiments of the present disclosure can also be carried out, and as long as they do not violate the idea of the present disclosure, they should also be regarded as the contents disclosed in the present disclosure.

What is claimed is:

1. A data center cooling system, comprising a cooling tower, an air cooling unit, a liquid cooling unit and a cabinet, the air cooling unit comprising a first heat exchanger, a fan and an air returning channel, the liquid cooling unit comprising a second heat exchanger, the cabinet comprising a server, wherein the server comprises a central processing unit that is provided with a cold plate, wherein the server further comprises a hard disk drive, a network interface controller, a dual inline memory module and a power supply, and wherein the central processing unit, the hard disk drive, the network interface controller, the dual inline memory module and the power supply are all arranged between an air inlet of the server and an air outlet of the server;
   a coolant outlet of the cooling tower is connected to a coolant inlet of the first heat exchanger and a first coolant inlet of the second heat exchanger, a coolant outlet of the first heat exchanger and a first coolant outlet of the second heat exchanger are connected to a coolant inlet of the cooling tower, a second coolant outlet of the second heat exchanger is connected to a coolant inlet of the server, and a coolant outlet of the server is connected to a second coolant inlet of the second heat exchanger, wherein the coolant inlet of the server is a coolant inlet of the cold plate, and the coolant outlet of the server is an coolant outlet of the cold plate;
   an air inlet of the air returning channel is connected to the air outlet of the server and is configured to transport air flowing out of the air outlet of the server to the first heat exchanger, the fan is configured to cause the air flowing out of an air outlet of the air returning channel to flow to the server after flowing through the first heat exchanger, so that the air flow through the first heat exchanger can enter the server through the air inlet of the server.

2. The data center cooling system of claim 1, wherein the air inlet of the server is arranged opposite to the air outlet of the server, the hard disk drive and the network interface controller are arranged close to the air inlet of the server, the power supply is arranged close to the air outlet of the server, and the central processing unit and the dual inline memory module are located between both the hard disk drive and the network interface controller and the power supply.

3. The data center cooling system of claim 1, wherein both the central processing unit and the cold plate are multiple, the multiple cold plates and the multiple central processing units are arranged in one-to-one correspondence, and the multiple cold plates are connected in series or in parallel with each other.

4. The data center cooling system of claim 1, wherein the cabinet comprises a plurality of servers, the cabinet further comprises a water segregator and a water collector, the water segregator comprises a water segregating pipe, a first water incoming port and a first water outcoming port arranged on the water segregating pipe, the first water outcoming port is multiple, and the water collector comprises a water collecting pipe, a second water incoming port and a second water outcoming port arranged on the water collecting pipe, the second water incoming port is multiple;

the second coolant outlet of the second heat exchanger is connected to the first water incoming port, each first water outcoming port is connected to the coolant inlet of the corresponding server, each second water incoming port is connected to the coolant outlet of the corresponding server, and the second water outcoming port is connected to the second coolant inlet of the second heat exchanger.

5. The data center cooling system of claim 1, wherein at least one of a filtering device, a sterilization device, and a descaling device is provided at the second coolant outlet of the second heat exchanger.

6. The data center cooling system of claim 1, wherein the air cooling unit further comprises a mounting structure on which an air incoming hole and an air outcoming hole are formed, and the first heat exchanger and the fan are mounted on the mounting structure and are located between the air incoming hole and the air outcoming hole;

wherein the air outlet of the air returning channel is connected to the air incoming hole; or, the mounting structure is configured to be arranged in a machine room, and to separate the interior of the machine room into a first space and a second space, the air incoming hole is located on a side of the mounting structure close to the first space, and the air outcoming hole is located on a side of the mounting structure close to the second space, the server is arranged within the second space, and the air outlet of the air returning channel is in communication with the first space.

7. The data center cooling system of claim 6, wherein the air cooling unit further comprises an air filtering mesh arranged at the air incoming hole.

8. The data center cooling system of claim 1, wherein the data center cooling system further comprises a first water pump and a second water pump, the first water pump is configured to pump the coolant flowing out of the coolant outlet of the cooling tower to the first heat exchanger and the second heat exchanger, and the water pump is configured to pump the coolant flowing out of the second coolant outlet of the second heat exchanger to the server.

9. The data center cooling system of claim 1, wherein the data center cooling system further comprises a first switching valve and a second switching valve, the first switching valve is arranged at the coolant outlet of the first heat exchanger and/or the first coolant outlet of the second heat exchanger, and the second switching valve is arranged at the coolant inlet of the server.

10. A data center, comprising a data center cooling system, the data center cooling system comprising a cooling tower, an air cooling unit, a liquid cooling unit and a cabinet, the air cooling unit comprising a first heat exchanger, a fan and an air returning channel, the liquid cooling unit comprising a second heat exchanger, the cabinet comprising a server, wherein the server comprises a central processing unit that is provided with a cold plate, wherein the server further comprises a hard disk drive, a network interface controller, a dual inline memory module and a power supply, and wherein the central processing unit, the hard disk drive, the network interface controller, the dual inline memory module and the power supply are all arranged between an air inlet of the server and an air outlet of the server;

a coolant outlet of the cooling tower is connected to a coolant inlet of the first heat exchanger and a first coolant inlet of the second heat exchanger, a coolant outlet of the first heat exchanger and a first coolant outlet of the second heat exchanger are connected to a coolant inlet of the cooling tower, a second coolant outlet of the second heat exchanger is connected to a coolant inlet of the server, and a coolant outlet of the server is connected to a second coolant inlet of the second heat exchanger, wherein the coolant inlet of the server is a coolant inlet of the cold plate, and the coolant outlet of the server is an coolant outlet of the cold plate;

an air inlet of the air returning channel is connected to the air outlet of the server and is configured to transport air flowing out of the air outlet of the server to the first heat exchanger, the fan is configured to cause the air flowing out of an air outlet of the air returning channel to flow to the server after flowing through the first heat exchanger, so that the air flow through the first heat exchanger can enter the server through the air inlet of the server.

11. The data center of claim 10, wherein the air inlet of the server is arranged opposite to the air outlet of the server, the hard disk drive and the network interface controller are arranged close to the air inlet of the server, the power supply is arranged close to the air outlet of the server, and the central processing unit and the dual inline memory module are located between both the hard disk drive and the network interface controller and the power supply.

12. The data center of claim 10, wherein both the central processing unit and the cold plate are multiple, the multiple cold plates and the multiple central processing units are arranged in one-to-one correspondence, and the multiple cold plates are connected in series or in parallel with each other.

13. The data center of claim 10, wherein the cabinet comprises a plurality of servers, the cabinet further comprises a water segregator and a water collector, the water segregator comprises a water segregating pipe, a first water incoming port and a first water outcoming port arranged on the water segregating pipe, the first water outcoming port is multiple, and the water collector comprises a water collecting pipe, a second water incoming port and a second water outcoming port arranged on the water collecting pipe, the second water incoming port is multiple;

the second coolant outlet of the second heat exchanger is connected to the first water incoming port, each first water outcoming port is connected to the coolant inlet of the corresponding server, each second water incoming port is connected to the coolant outlet of the corresponding server, and the second water outcoming port is connected to the second coolant inlet of the second heat exchanger.

14. The data center of claim 10, wherein at least one of a filtering device, a sterilization device, and a descaling device is provided at the second coolant outlet of the second heat exchanger.

15. The data center of claim 10, wherein the air cooling unit further comprises a mounting structure on which an air incoming hole and an air outcoming hole are formed, and the first heat exchanger and the fan are mounted on the mounting structure and are located between the air incoming hole and the air outcoming hole;

wherein the air outlet of the air returning channel is connected to the air incoming hole; or, the mounting structure is configured to be arranged in a machine room, and to separate the interior of the machine room into a first space and a second space, the air incoming hole is located on a side of the mounting structure close to the first space, and the air outcoming hole is located on a side of the mounting structure close to the second space, the server is arranged within the second space, and the air outlet of the air returning channel is in communication with the first space.

16. The data center of claim 15, wherein the air cooling unit further comprises an air filtering mesh arranged at the air incoming hole.

17. The data center of claim 10, wherein the data center cooling system further comprises a first water pump and a second water pump, the first water pump is configured to pump the coolant flowing out of the coolant outlet of the cooling tower to the first heat exchanger and the second heat exchanger, and the water pump is configured to pump the coolant flowing out of the second coolant outlet of the second heat exchanger to the server.

18. The data center of claim 10, wherein the data center cooling system further comprises a first switching valve and a second switching valve, the first switching valve is arranged at the coolant outlet of the first heat exchanger and/or the first coolant outlet of the second heat exchanger, and the second switching valve is arranged at the coolant inlet of the server.

* * * * *